United States Patent
Ryu et al.

(10) Patent No.: US 9,543,891 B2
(45) Date of Patent: Jan. 10, 2017

(54) LOW-POWER LOW-PHASE-NOISE OSCILLATOR

(71) Applicant: Texas Instruments Incorporated, Dallas, TX (US)

(72) Inventors: Seong-Ryong Ryu, Sunnyvale, CA (US); Ali Kiaei, San Jose, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/682,726

(22) Filed: Apr. 9, 2015

(65) Prior Publication Data

US 2016/0301364 A1  Oct. 13, 2016

(51) Int. Cl.
  *H03B 5/36* (2006.01)
  *H03B 5/30* (2006.01)
  *H03B 5/12* (2006.01)

(52) U.S. Cl.
  CPC .......... *H03B 5/1212* (2013.01); *H03B 5/1271* (2013.01); *H03B 5/30* (2013.01); *H03B 5/36* (2013.01)

(58) Field of Classification Search
  CPC ....... H03B 5/1212; H03B 5/1271; H03B 5/30; H03B 5/36
  USPC ........ 331/116 FE, 116 M, 158, 154, 117 FE, 331/167, 107 A
  See application file for complete search history.

(56) References Cited

U.S. PATENT DOCUMENTS

| | | | |
|---|---|---|---|
| 7,030,718 B1* | 4/2006 | Scherer | H03J 3/20 331/117 R |
| 2005/0184818 A1 | 8/2005 | Aikawa et al. | |
| 2009/0072917 A1* | 3/2009 | Yajima | H03B 5/326 331/108 R |
| 2010/0308927 A1* | 12/2010 | Rebel | H03B 5/30 331/1 R |
| 2011/0163819 A1 | 7/2011 | Badillo et al. | |
| 2014/0203872 A1 | 7/2014 | Sjoland | |

OTHER PUBLICATIONS

Enz et al., "Building Blocks for an Ultra Low-Power MEMS-based Radio," RFIT 007. IEEE International Workshop on Radio-Frequency Integration Technology, pp. 158-167, Dec. 9-11, 2007, Singapore.

Notification of Transmittal of the International Search Report and the Written Opinion of the International Searching Authority, or the Declaration. mail date: Jul. 14, 2016.

* cited by examiner

*Primary Examiner* — Arnold Kinkead
(74) *Attorney, Agent, or Firm* — Tuenlap Daniel Chan; Frank D. Cimino

(57) ABSTRACT

The present disclosure describes a low-power, low-phase-noise (LPLPN) oscillator. The LPLPN oscillator includes a resonator load, an amplifier stage, and a loop gain control circuit. The resonator load is structured to resonate at a primary resonant frequency. The amplifier stage is coupled with the resonator load to develop a loop gain that peaks at the primary resonant frequency. The loop gain control circuit is coupled with the amplifier stage, and it is structured to regulate the loop gain for facilitating the amplifier stage to generate an oscillation signal at the primary resonant frequency and suppress a noise signal at a parasitic parallel resonant frequency (PPRF).

20 Claims, 7 Drawing Sheets

LOW-POWER LOW-PHASE-NOISE OSCILLATOR

BACKGROUND

Conventional micro-electromechanical system based (MEMS-based) oscillators employ various techniques to avoid latch-up effects. Latch-up effects occur when an oscillator generates two differential outputs of which one stays at a high voltage (e.g., an internal supply voltage VDD) and the other one stays at a low voltage (e.g., an internal ground voltage VSS). Thus, an oscillator experiencing latch-up typically does not generate any oscillation signal. One approach involves adding a capacitor to the source ends of the oscillation ring to increase the effective transconductance of the oscillation ring. In general, the larger the capacitance of the added capacitor, the greater the effective transconductance, and thus, the more likely the latch-up effect can be avoided.

However, in order to prevent various relaxation oscillation conditions, the capacitance of the added capacitor typically does not exceed the load capacitance of the oscillation ring. Depending on the size of the load capacitance, the added capacitor might be restrained from providing sufficient capacitance for boosting the effective transconductance. As such, the added capacitor might be insufficient to avoid latch-up effects while preventing relaxation oscillation conditions at the same time. An alternative approach involves increasing the operational current of the oscillation ring, which helps increase the effective transconductance of the oscillation ring. This alternative approach, however, demands a greater power consumption, which might introduce various design constrains for a circuit that incorporates the oscillator.

In addition to latch-up effects, conventional MEMS-based oscillators typically exhibit parasitic effects due to the parasitic inductance of the bonding wires. These bonding wires can be found between a MEMS chip and an integrated circuit interacting with the MEMS chip. Under certain conditions, these parasitic effects may disrupt the operations of an oscillator. For instance, the parasitic effects of the bonding wires can push the loop gain of the oscillator above unity at a parasitic parallel resonant frequency (PPRF). As a result, an oscillator having these parasitic effects may generate a noise signal that oscillates outside of its intended operational frequency range.

In view of the aforementioned issues, there is a need for a low power low noise oscillator to minimize latch-up effects and parasitic effects experienced by the conventional oscillators.

SUMMARY

The present disclosure describes several low-power, low-phase-noise (LPLPN) oscillators. In one implementation, for example, an LPLPN oscillator includes a resonator load, an amplifier stage, and a loop gain control circuit. The resonator load is structured to resonate at a primary resonant frequency. The amplifier stage is coupled with the resonator load to develop a loop gain that peaks at the primary resonant frequency. The loop gain control circuit is coupled with the amplifier stage, and it is structured to regulate the loop gain for facilitating the amplifier stage to generate an oscillation signal at the primary resonant frequency and suppress a noise signal at a parasitic parallel resonant frequency (PPRF).

In another implementation, for example, an LPLPN oscillator includes a micro-electromechanical system based (MEMS-based) resonator, a pair of cross-coupled amplifiers, and an inductive-capacitive (LC) degeneration circuit. The MEMS-based resonator is structured to resonate at a primary resonant frequency. The pair of cross-coupled amplifiers is coupled with the MEMS-based resonator to develop a loop gain peaking at the primary resonant frequency. The LC degeneration circuit is coupled with the pair of cross-coupled amplifiers, and it is structured to regulate the loop gain for facilitating the pair of cross-coupled amplifier to generate an oscillation signal at the primary resonant frequency and suppress a noise signal at a parasitic parallel resonant frequency (PPRF).

In yet another implementation, for example, an LPLPN oscillator includes an inductive-capacitive (LC) load network, a first stage amplifier, a second stage amplifier, and a loop gain control circuit. The inductive-capacitive (LC) load network is structured to resonate at a primary resonant frequency. The first stage amplifier is coupled with a first end of the LC load network. The second stage amplifier is cross-coupled with the first stage amplifier, and it is coupled with a second end of the LC load network to jointly develop a loop gain with the first stage amplifier. The loop gain control circuit is coupled between the first stage amplifier and the second stage amplifier. The loop gain control circuit is structured and routed to increase the loop gain above unity at the primary resonant frequency and reduce the loop gain below unity at a parasitic parallel resonant frequency (PPRF).

In still another implementation, for example, an LPLPN oscillator system includes a first die and a second die. The first die has a micro-electromechanical system based (MEMS-based) resonator structured to resonate at a primary resonant frequency. The second die has a pair of cross-coupled amplifiers that is coupled with the MEMS-based resonator to develop a loop gain peaking at the primary resonant frequency. The second die also has a LC degeneration circuit coupled with the pair of cross-coupled amplifiers. The LC degeneration circuit is structured to regulate the loop gain for facilitating the pair of cross-coupled amplifier to generate an oscillation signal at the primary resonant frequency and suppress a noise signal at a parasitic parallel resonant frequency (PPRF). To couple the MEMS-based resonator with the pair of cross-coupled amplifiers, the LPLPN oscillator system further includes interconnects connecting the first die with the second dies. According to an aspect of the present disclosure, the interconnects create a parasitic structure that contributes to the PPRF.

For example, one or more disclosed embodiments can be implemented in various systems and apparatus, including, but not limited to, a special purpose data processing apparatus (e.g., a wireless communication device such as a wireless access point, a remote environment monitor, a router, a switch, a computer system component, a medium access unit), a mobile data processing apparatus (e.g., a wireless client, a cellular telephone, a smart phone, a personal digital assistant (PDA), a mobile computer, a digital camera), a general purpose data processing apparatus such as a computer, or combinations of these.

Details of one or more implementations of the present disclosure are set forth in the accompanying drawings and the description below. Other features and advantages may be apparent from the description and drawings, and from the claims.

DRAWING DESCRIPTIONS

Like reference symbols in the various drawings indicate like elements. Details of one or more implementations of the present disclosure are set forth in the accompanying drawings and the description below. Other features and advantages may be apparent from the description and drawings, and from the claims.

DETAILED DESCRIPTION

The subject matter described herein includes details and implementations of a low-power, low-phase-noise (LPLPN) oscillator system. From a functional standpoint, the LPLPN oscillator system provides an architecture in which the loop gain of an oscillation ring is regulated to ensure the oscillation frequency of an oscillation signal is within the operation range of the oscillator system. In one aspect, the disclosed architecture presents a low-power solution to address latch-up effects experienced by conventional oscillators. In another aspect, the disclosed architecture presents a low-phase-noise solution to address parasitic effects experienced by conventional MEMS-based oscillators.

Figure 1:
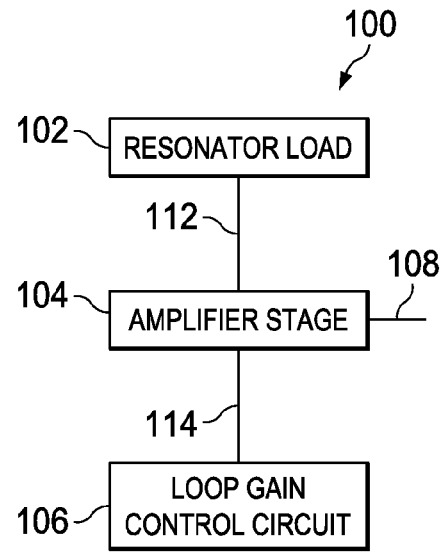
FIG. 1 shows a schematic view of an exemplary low-power low-phase-noise (LPLPN) oscillator system according to an aspect of the present disclosure.

FIG. 1 shows a schematic view of an exemplary low-power, low-phase-noise (LPLPN) oscillator system 100 according to an aspect of the present disclosure. The LPLPN oscillator system 100 includes a resonator load 102, an amplifier stage 104, and a loop gain control circuit 106. The resonator load 102 is coupled with the amplifier stage 104 via a first connection 112. The resonator load 102 is structured to resonate at a primary resonant frequency. In one implementation, for example, the primary resonant frequency may range from 300 MHz to 4 GHz.

The resonator load 102 provides load impedance ($Z_L$) to the amplifier stage 104, which helps partially define the loop gain ($G_{LP}$) of the amplifier stage 104. The amplifier stage 104 has an effective transconductance ($G_m$) that is a function of the intrinsic transconductance ($g_m$) defined by one or more amplifying transistors within the amplifier stage 104. The intrinsic transconductance ($g_m$) of an amplifying transistor can be adjusted by a current source supplying a bias current for biasing that amplifying transistor. When the amplifying transistor is in a linear region, the intrinsic transconductance ($g_m$) increases with the bias current. Upon being properly biased, the amplifier stage 104 will develop the loop gain ($G_{LP}$) along a frequency spectrum. According to an aspect of the present disclosure, for example, the loop gain of the amplifier stage 104 is defined as a product of the load impedance ($Z_L$) and the effective transconductance ($G_m$) of the amplifier stage 104 as expressed in Equation 1.

$$G_{LP} = Z_L(G_m) \qquad \text{Eq.(1)}$$

Based on the frequency characteristics of the load impedance ($Z_L$), the loop gain ($G_{LP}$) may vary along the frequency spectrum. In general, the loop gain ($G_{LP}$) is boosted around the primary resonant frequency such that the loop gain ($G_{LP}$) can reach a peak at the primary resonant frequency. When the loop gain ($G_{LP}$) is greater than unity (e.g., greater than 1), the amplifier stage 104 will enter an oscillation mode, in which the amplifier stage 104 is configured to generate an output signal 108 that oscillates at the primary resonant frequency. When the loop gain ($G_{LP}$) is less than unity (e.g., less than 1), the amplifier stage 104 will enter a common mode, in which the amplifier stage 104 does not generate any output signal 108 that oscillates.

Depending on whether the resonator load 102 is formed within the same semiconductor die as the amplifier stage 104, the first connection 112 may have different impedance characteristics. In one implementation, for example, the first connection 112 may have a high impedance characteristic because the resonator load 102 is formed on a first die whereas the amplifier stage 104 is formed on a second die. Under this particular implementation, the first connection 112 may include bonding pads attached to the first die and the second die respectively, as well as one or more bonding wires connecting the bonding pads of the respective first and second dies.

The high impedance characteristics of the first connection 112 may impact the frequency at which the amplifier stage 104 generates an output signal that oscillates. For instance, when the first connection 112 has sufficiently high impedance at a frequency range outside of (e.g., 3 times or above) the primary resonant frequency of the resonator load 102, the amplifier stage 104 may generate an output signal 108 embedded with a noise signal that oscillates at a parasitic parallel resonant frequency (PPRF). In some situations, the noise signal can lead to a degradation of performance of the LPLPN oscillator system 100, especially when the PPRF deviates substantially from the primary resonant frequency.

The loop gain control circuit 106, which is coupled with the amplifier stage 104 via a second connection 114, is configured and structured to ensure that the LPLPN oscillator system 100 delivers the output signal 108 that oscillates at the primary resonant frequency and suppresses noise signals that oscillate at other PPRFs. Depending on the applicable process, the loop gain control circuit 106 may be formed on the same die as the amplifier stage 104. In such a single-die configuration, the impedance characteristics of the second connection 114 should be substantially low and vary little across a frequency spectrum.

The loop gain control circuit 106 has a circuit structure that is adapted to adjust the effective transconductance ($G_m$) of the amplifier stage 104. In one implementation, for example, the loop gain control circuit 106 is structured to boost the effective transconductance ($G_m$) of the amplifier stage 104 at the primary resonant frequency. Advantageously, such a boost can enhance the loop gain ($G_{LP}$) beyond unity but without increasing the bias current. With this enhanced loop gain ($G_{LP}$), the LPLPN oscillator system 100 is able to generate an oscillation signal at the primary resonant frequency while conserving power.

In another implementation, for example, the loop gain control circuit 106 is structured to suppress or substantially reduce the effective transconductance ($G_m$) of the amplifier stage 104 over a range of PPRFs. Advantageously, such suppression can effectively offset the high impedance characteristics of the first connection 112. With the suppressed effective transconductance ($G_m$), the loop gain ($G_{LP}$) of the amplifier stage 104 can be kept below unity over a range of PPRFs. As a result, the output signal 108 is filtered from noise signals that oscillate at one or more PPRFs.

Although the resonator load 102 can be manufactured on a semiconductor die separately from the semiconductor die on which the amplifier stage 104 is manufactured, the resonator load 102 can also be manufactured on the same semiconductor die as the amplifier stage 104. Under the single-die manufacturing scheme, the impedance characteristics of the first connection 112 should have less impact on the loop gain ($G_{LP}$) of the amplifier stage 104, thereby rendering the suppression function of the loop gain control circuit 106 more effective.

Figure 2:
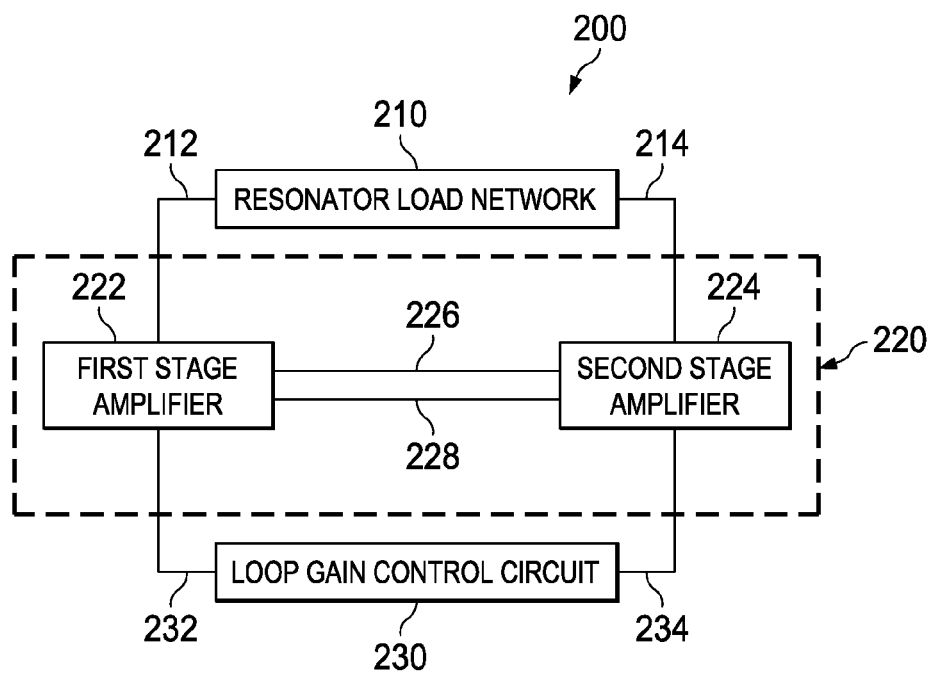
FIG. 2 shows a schematic view of an exemplary LPLPN oscillator system with a cross-coupled amplifier pair according to an aspect of the present disclosure.

FIG. 2 shows a schematic view of an exemplary LPLPN oscillator system 200 with a cross-coupled amplifier pair 220 according to an aspect of the present disclosure. From a circuit architectural standpoint, the LPLPN oscillator system 200 provides a specific implementation of the LPLPN oscillator system 100. The LPLPN oscillator system 200 includes a resonator load network 210, a cross-coupled amplifier pair 220, and a loop gain control circuit 230.

The resonator load network 210 serves the functions of the resonator load 102 as discussed in association with FIG. 1. And more specifically, the resonator load network 210 may include one or more resonator loads that are interconnected to form a network. In one implementation, for example, the resonator load network 210 may include one resonator load, such as the resonator load 102, that is structured to provide one primary resonant frequency. In another implementation, for example, the resonator load network 210 may include two resonator loads, each of which is structured to provide a distinctive primary resonant frequency. As such, the resonator load network 210 under this particular implementation may further include an option circuitry that is configured to select either one of the distinctive primary resonant frequencies. Advantageously, this particular implementation allows the LPLPN oscillator system 200 to generate an output signal (which can be delivered by a first stage feedback signal 226 and/or a second stage feedback signal 228) that can selectively oscillate at multiple primary resonant frequencies.

The resonator load network 210 is coupled with the cross-coupled amplifier pair 220 via a first connection 212 and a second connection 214. The cross-coupled amplifier pair 220 exemplifies an implementation of the amplifier stage 104 as described in association with FIG. 1. The cross-coupled amplifier pair 220 includes a first stage amplifier 222 cross-coupled with a second stage amplifier 224 to form an amplifier loop. In one implementation, for example, the first stage amplifier 222 is configured to generate a first stage output that is fed back to the second stage amplifier 224 via a first stage feedback signal 226; whereas the second stage amplifier 224 is configured to generate a second stage output that is fed back to the first stage amplifier 222 via a second stage feedback signal 228.

The first stage amplifier 222 and the second stage amplifier 224 can be configured using various amplification techniques. For instance, the first stage amplifier 222 and the second stage amplifier 224 can both adopt a common source configuration. The first and second stage amplifiers 222 and 224 are coupled with the resonator load network 210 via two separate paths. Particularly, the first stage amplifier 222 is coupled with the resonator load network 210 via the first connection 212 whereas the second stage amplifier 224 is coupled with the resonator load network 210 via the second connection 214.

Like the amplifier stage 104 as discussed with respect to FIG. 1, the first stage amplifier 222 and the second stage amplifier 224 each has an intrinsic transconductance ($g_m$). The intrinsic transconductance ($g_{m1,2}$) of the first stage amplifier 222 and the second stage amplifier 224 is typically a function of the associated bias current that biases the respective amplifier. In turn, the effective transconductance ($G_{m1,2}$) of the first stage amplifier 222 and the second stage amplifier 224 is a function of the intrinsic transconductance ($g_{m1,2}$) thereof respectively. Together, the first stage amplifier 222 and the second stage amplifier 224 develop a loop gain ($G_{LP}$) under the common-mode load impedance ($Z_L$) of the resonator load network 210 as expressed in Equation 2.

$$G_{LP}=[Z_L(G_m)]^2 \qquad \text{Eq.(2)}$$

Based on the frequency characteristics of the common-mode load impedance ($Z_L$), the loop gain ($G_{LP}$) may vary along the frequency spectrum. Consistent with the aforementioned description, the loop gain ($G_{LP}$) is boosted around the primary resonant frequency so that it peaks at the primary resonant frequency. When the loop gain ($G_{LP}$) is greater than unity (e.g., greater than 1), the cross-coupled amplifier pair 220 will enter an oscillation mode, in which the first and second stage amplifiers 222 and 224 is configured to generate a pair of output signals (e.g., the first and second stage feedback signals 226 and 228) that oscillate at the primary oscillation frequency. When the loop gain ($G_{LP}$) is less than unity (e.g., less than 1), the cross-coupled amplifier pair 220 will enter a common mode, in which the first and second stage amplifiers 222 and 224 do not generate any output that oscillates.

Depending on whether the resonator load network 210 is formed within the same semiconductor die as the cross-coupled amplifier pair 220, the first and second connections 212 and 214 may have impedance characteristics that impact the loop gain ($G_{LP}$) of the LPLPN oscillator system 200. In one implementation, for example, the first and second connections 212 and 214 may each have a high impedance characteristic because the resonator load network 210 and the cross-coupled amplifier pair 220 are formed on separate semiconductor dies. Under this particular implementation, the first and second connections 212 and 214 may each include bonding pads respectively attached to the two semiconductor dies, as well as one or more bonding wires connecting the bonding pads of the respective dies.

The high impedance characteristics of the first and second connections 212 and 214 may impact the frequency at which the first and second stage amplifiers 222 and 224 generate the oscillation outputs. Consistent with the aforementioned disclosure, the outputs delivered by the first and second stage feedback signals 226 and 228 can be embedded with one or more noise signals that oscillate at a parasitic parallel resonant frequency (PPRF). In some situations, the noise signals can lead to a degradation of performance of the LPLPN oscillator system 200, especially when the PPRF deviates substantially from the primary resonant frequency.

The loop gain control circuit 230 performs similar functions as the loop gain control circuit 106 as described with respect to FIG. 1. In general, the loop gain control circuit 106 is coupled between the first stage amplifier 222 and the second stage amplifier 224. More specifically, the loop gain control circuit 230 is coupled with the first stage amplifier 222 via a third connection 232 and with the second stage amplifier 224 via a fourth connection 234. The loop gain control circuit 230 is configured and structured to ensure that the LPLPN oscillator system 200 delivers an oscillation signal that oscillates at the primary resonant frequency and suppresses noise signals that oscillate at other PPRFs. Depending on the applicable process, the loop gain control circuit 230 may be formed on the same die as the cross-coupled amplifier pair 220. In such a single-die configuration, the impedance characteristics of the third and fourth connections 232 and 234 should be substantially low and vary little across a frequency spectrum.

The loop gain control circuit 230 has a circuit structure that is adapted to adjust a first effective transconductance ($G_{m1}$) of the first stage amplifier 222 as well as a second effective transconductance ($G_{m2}$) of the second stage amplifier 224. In one implementation, for example, the loop gain control circuit 230 is structured to boost the first effective transconductance ($G_{m1}$) and the second effective transconductance ($G_{m2}$) at the primary resonant frequency. Advantageously, such a boost can enhance the loop gain ($G_{LP}$) beyond unity but without increasing the bias current. With this enhanced loop gain ($G_{LP}$), the LPLPN oscillator system 200 is able to generate an oscillation signal at the primary resonant frequency while conserving power.

In another implementation, for example, the loop gain control circuit 230 is structured to suppress or substantially reduce the first effective transconductance ($G_{m1}$) and the second effective transconductance ($G_{m2}$) over a range of PPRFs. Advantageously, such suppression can effectively offset the high impedance characteristics of the first and second connections 212 and 214. With the suppressed effective transconductance ($G_{m1, 2}$), the loop gain ($G_{LP}$) of the amplifier stage 104 can be kept below unity over a range of PPRFs. As a result, the output signals are filtered from noise signals that oscillate at one or more PPRFs.

Although the resonator load network 210 can be manufactured on a semiconductor die separately from the semiconductor die on which the cross-coupled amplifier pair 220 is manufactured, the resonator load network 210 can also be manufactured on the same semiconductor die as the cross-coupled amplifier pair 220. Under the single-die manufacturing process, the impedance characteristics of the first and second connections 112 and 114 should have less impact on the loop gain ($G_{LP}$) of the cross-coupled amplifier pair 220, thereby rendering the suppression function of the loop gain control circuit 230 more effective.

Figure 3:
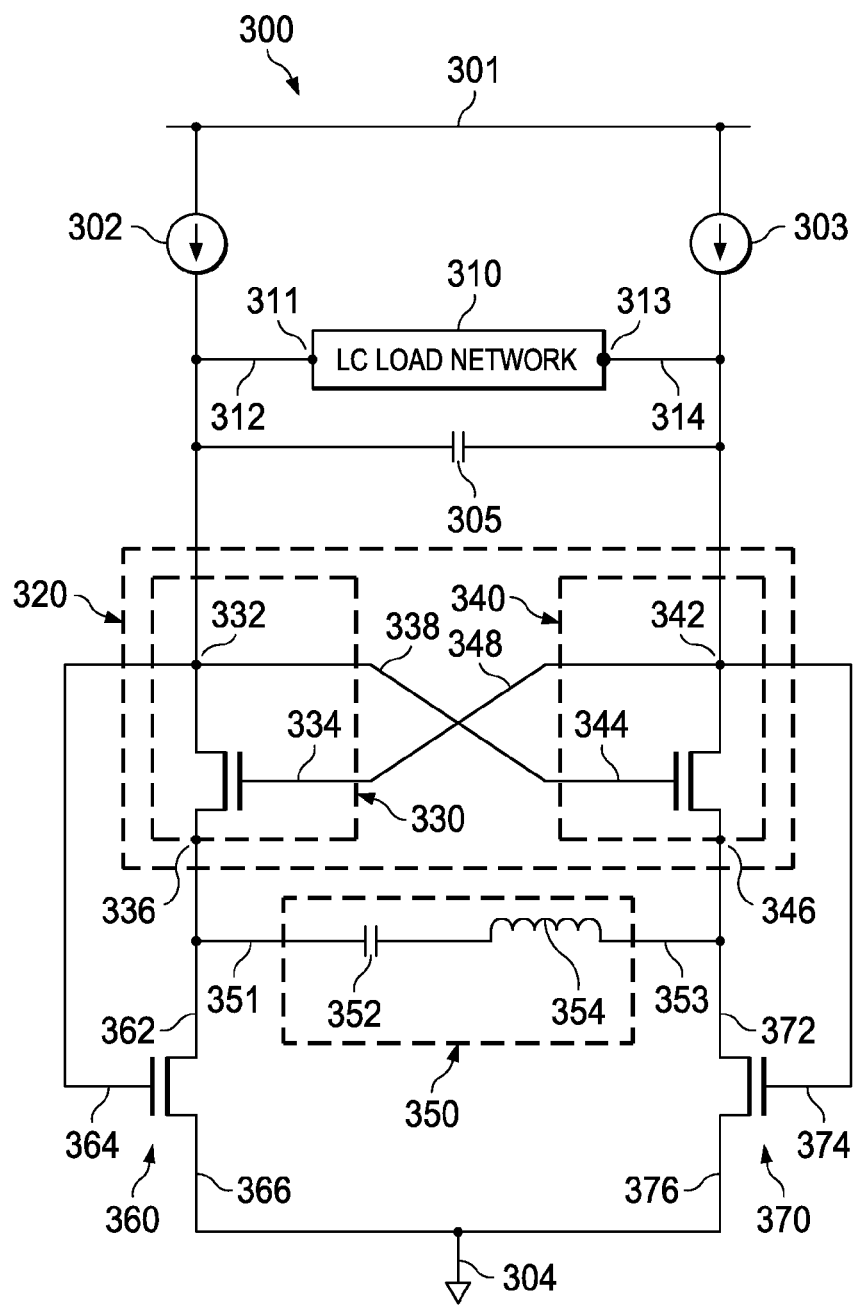
FIG. 3 shows a schematic view of an exemplary LPLPN oscillator system with a degeneration circuit according to an aspect of the present disclosure.

FIG. 3 shows a schematic view of an exemplary LPLPN oscillator system 300 with a degeneration circuit 350 according to an aspect of the present disclosure. From a circuit architectural standpoint, the LPLPN oscillator system 300 provides a specific implementation of the LPLPN oscillator system 100 as well as the LPLPN oscillator system 200. The LPLPN oscillator system 300 is operable between a power source 301 and a ground source 304. The power source 301 provides an internal voltage for driving a first current source 302 and a second current source 303.

In general, the LPLPN oscillator system 300 includes an inductive-capacitive (LC) load network 310, a cross-coupled amplifier pair 320, and an inductive-capacitive (LC) degeneration circuit 350. Consistent with the aforementioned descriptions in association with FIG. 2, the LC load network 310 is structured and configured to perform the functions of the resonator load network 210. The cross-coupled amplifier pair 320 exemplifies an implementation of the cross-coupled amplifier pair 220 and the amplifier stage 104. And the LC degeneration circuit 350 exemplifies an implementation of the loop gain control circuit 230 and the loop gain control circuit 106.

The LC load network 310 includes one or more LC circuitries that are interconnected to form a network. In one implementation, for example, the resonator load network 310 may include one series of LC components that are set up to provide one primary resonant frequency. In another implementation, for example, the LC load network 310 may include two series of LC components, and each series is set up to provide a distinctive primary resonant frequency. As such, the LC load network 310 under this particular implementation may further include an option circuitry that is configured to select either one of the distinctive primary resonant frequencies. Advantageously, this particular implementation allows the LPLPN oscillator system 300 to generate an output signal (which can be delivered at nodes 332 and 342) that can selectively oscillate at multiple primary resonant frequencies.

The LC load network 310 has a first end 311 and a second end 313 each for providing a connection point for connecting with the cross-coupled amplifier pair 330. According to an aspect of the present disclosure, the LC load network 310 can be implemented by a micro-electromechanical system based (MEMS-based) device. The MEMS-based device can be incorporated to an integrated circuit that includes the cross-coupled amplifier pair 320 and the LC degeneration circuit 350. In this particular implementation, the LC load network 310 is connected to the cross-coupled amplifier pair 320 through a pair of high impedance connection paths, such as a first high parasitic connection path 312 and a second high parasitic connection path 314.

According to another aspect of the present disclosure, the LC load network 310 can be implemented within an integrated circuit that includes the cross-coupled amplifier pair 320 and the LC degeneration circuit 350. In this particular implementation, the LC load network 310 is connected to the cross-coupled amplifier pair 320 through a pair of connection paths that have much lower impedance than the first and second high parasitic connection paths 312 and 314.

The cross-coupled amplifier pair 320 includes a first common-source (CS) amplifier 330 cross-coupled with a second CS amplifier 340 to form an amplifier loop. The first CS amplifier 330 includes a first drain node 332, a first gate 334, and a first source node 336. Mirroring the configuration of the first CS amplifier 330, the second CS amplifier 340 includes a second drain node 342, a second gate 344, and a second source node 346. Consistent with the aforementioned disclosure, the first and second CS amplifiers 330 and 340 provide specific implementations for the first and second stage amplifiers 222 and 224 as discussed in FIG. 2.

The first CS amplifier 330 is configured to provide a first stage feedback signal 338 to the second CS amplifier 340. In return, the second CS amplifier is configured to provide a second stage feedback signal 348 to the first CS amplifier 330. In one configuration, for example, the first CS amplifier 330 and the second CS amplifier 340 are properly biased to operate within their respective linear regions. Although FIG. 3 shows that the first and second CS amplifiers 330 and 340 are implemented using two NMOS transistors, the first and second CS amplifiers 330 and 340 may adopt other types of transistors with semiconducting properties that are consistent with the applications of the first and second CS amplifiers 330 and 340 as described herein.

The first drain node 332 is coupled with the first current source 302 for receiving the first bias current. The first drain node 332 is also coupled with the first end 311 of the LC load network 310, and particularly via the first high parasitic connection path 312 if the LC load network 310 is implemented on a MEMS-based device. Alternatively, the first drain node 332 can be coupled with the first end 311 of the LC load network 310 via interconnects if the LC load network 310 is implemented on the same integrated circuit as the first CS amplifier 330.

The first gate 334 is coupled with the second drain node 342 to receive the second stage feedback signal 348. Based on the received second stage feedback signal 348, the first gate 334 is configured to regulate the amount of first bias current that flows through a first channel defined between the first drain node 332 and the first source node 336. From there, the first gate 334 is configured to adjust a first output signal delivered at the first drain node 332. Because the first drain node 332 is coupled with the second gate 344 of the second CS amplifier 340, the first output signal serves as the first stage feedback signal 338 to be fed to the second gate 344 of the second CS amplifier 340.

The first CS amplifier 330 also has a first intrinsic transconductance ($g_{m1}$), which represents the semiconducting properties of the first CS amplifier 330. In general the first intrinsic transconductance ($g_{m1}$) can be adjusted by changing the first bias current provided by the first current source 302. For example, the first intrinsic transconductance ($g_{m1}$) can be enhanced by increasing the first bias current when the first CS amplifier 330 is in its linear region. The first intrinsic transconductance ($g_{m1}$) partially defines the first effective transconductance ($G_{m1}$) of the first CS amplifier 330. In turn, the first effective transconductance ($G_{m1}$) partially contributes to the loop gain ($G_{LP}$) of the cross-coupled amplifier pair 320.

Within the second CS amplifier 340, the second drain node 342 is coupled with the second current source 303 for receiving the second bias current. The second drain node 342 is also coupled with the second end 313 of the LC load network 310, particularly via the second high parasitic connection path 314 if the LC load network 310 is implemented on a MEMS-based device. Alternatively, the second drain node 342 can be coupled with the second end 313 of the LC load network 310 via interconnects if the LC load network 310 is implemented on the same integrated circuit as the second CS amplifier 340.

The second gate 344 is coupled with the first drain node 332 to receive the first stage feedback signal 338. Based on the received first stage feedback signal 338, the second gate 344 is configured to regulate the amount of second bias current that flows through a second channel defined between the second drain node 342 and the second source node 346. From there, the second gate 344 is configured to adjust a second output signal delivered at the second drain node 342. Because the second drain node 342 is coupled with the first gate 334 of the first CS amplifier 330, the second output signal serves as the second stage feedback signal 348 to be fed to the first gate 334 of the first CS amplifier 330.

The second CS amplifier 340 also has a second intrinsic transconductance ($g_{m2}$), which represents the semiconducting properties of the second CS amplifier 340. In general the second intrinsic transconductance ($g_{m2}$) can be adjusted by changing the second bias current provided by the second current source 303. For example, the second intrinsic transconductance ($g_{m2}$) can be enhanced by increasing the second bias current when the second CS amplifier 340 is in its linear region. The second intrinsic transconductance ($g_{m2}$) partially defines the second effective transconductance ($G_{m2}$) of the second CS amplifier 340. In turn, the second effective transconductance ($G_{m2}$) partially contributes to the loop gain ($G_{LP}$) of the cross-coupled amplifier pair 320.

Consistent with the aforementioned descriptions of the loop gain control circuits (e.g., the loop gain control circuits 106 and 230), the LC degeneration circuit 350 includes a circuit structure that is configured to regulate the loop gain ($G_{LP}$) of the cross-coupled amplifier pair 320. In doing so, the LC degeneration circuit 350 facilitates the generation of an oscillation signal that oscillates at one or more primary resonant frequencies as established by the LC load network 310. Moreover, the LC degeneration circuit 350 helps suppress a noise signal that oscillates over a range of PPRFs.

According to an aspect of the present disclosure, the LC degeneration circuit 350 provides a means for regulating the loop gain ($G_{LP}$) by adjusting the first and second effective transconductance ($G_{m1,2}$) of the first and second CS amplifiers 330 and 340. In one implementation, for example, the LC degeneration circuit 350 includes a series of LC components to provide a means for boosting the effective transconductance ($G_{m1,2}$) at the primary resonant frequency. In another implementation, for example, the LC degeneration circuit 350 includes a series of LC components to provide a means for reducing the effective transconductance ($G_{m1,2}$) over a range of PPRFs. Accordingly, the LC degeneration circuit 350 provides a means for degenerating the parasitic effects of the first and second high parasitic connection paths 312 and 314.

The degeneration circuit 350 is coupled with the cross-coupled amplifier pair 320 to adjust the first and second effective transconductance ($G_{m1,2}$). In one implementation, for example, the LC degeneration circuit 350 is coupled between the first and second CS amplifiers 330 and 340. The LC degeneration circuit 350 includes a first terminal 351 for connecting with the first source node 336 of the first CS amplifier 330. And the LC degeneration circuit 350 includes a second terminal 353 for connecting with the second source node 346 of the second CS amplifier 340. Based on this particular connectivity, the degeneration circuit 350 provides an electrical structure that defines a source impedance of the first and second CS amplifiers 330 and 340.

In one implementation, for example, the degeneration circuit 350 includes a source capacitor 352 connected in series with a source inductor 354. The source capacitor 352 and the source inductor 354 jointly define the source impedance (Zs) for the first and second CS amplifiers 330 and 340 as expressed in Equation 3.

$$Z_S = \frac{1}{S_C} + S_L \qquad \text{Eq. (3)}$$

Under a common-mode setup, the source impedance (Zs) can be used for adjusting the effective transconductance ($G_{m1,2}$) according to Equation 4.

$$G_{m_{1,2}} = \frac{1}{\frac{1}{g_{m_{1,2}}} + z_S} \qquad \text{Eq. (4)}$$

Incorporating Equation 3 to Equation 4, the effective transconductance ($G_{m1,2}$) can be expressed as a function of the respective impedance of the source capacitor 352 and the source inductor 354 as shown in Equation 5.

$$G_{m_{1,2}} = \frac{1}{\frac{1}{g_{m_{1,2}}} + \frac{1}{S_C} + S_L} \qquad \text{Eq. (5)}$$

According to an aspect of the present disclosure, the impedance of the source capacitor 352 and the impedance of the source inductor 354 are calibrated to cancel each other at the primary resonant frequency as established by the LC load network 310. In doing so, the source impedance (Zs) has a minimum value substantially equals zero when the cross-coupled amplifier pair 320 operates at the primary resonant frequency. As a result, the effective transconductance ($G_{m1, 2}$) of the first and second CS amplifiers 330 and 340 is boosted by the LC degeneration circuit 350 at the primary resonant frequency to a value that equals, or is substantially close to, the intrinsic transconductance ($g_{m1,2}$) of the respective CS amplifiers 330 and 340. Assuming the primary resonant frequency is $f_o$ (which is a function of the load impedance ($Z_L$)), the product of the source inductor 354 and the source capacitor 352 can be expressed by Equation 6.

$$LC = \left(\frac{1}{2\pi f_0}\right)^2 \qquad \text{Eq. (6)}$$

To that end, the LC degeneration circuit 350 serves as a means for adjusting the loop gain ($G_{LP}$) of the LPLPN oscillator system 300. And to a great extent, the LC degeneration circuit 350 frees the LPLPN oscillator system 300 from having to rely on adjusting the first and second current sources 302 and 303 in order to boost up the loop gain ($G_{LP}$) at the primary resonant frequency. Advantageously, the LC degeneration circuit 350 facilitates the generation of the oscillation signal at the primary resonant frequency while conserving power for the LPLPN oscillator system 300.

Outside of the primary resonant frequency, the LC degeneration circuit 350 provides a substantially larger source impedance (Zs) that servers as a means for reducing the effective transconductance ($G_{M1,2}$) of the first and second CS amplifier 330 and 340. The reduction of the effective transconductance ($G_{M1,2}$) translates to the suppression of the loop gain ($G_{LP}$) of the cross-coupled amplifier pair 320 to a value that is below unity. At the PPRF range, the source capacitor 352 behaves like a short circuit while the source inductor 354 demonstrates a substantial amount of impedance. To offset the effective load impedance's ($Z_{LE}$) contribution to the loop gain ($G_{LP}$), the source inductor 354 can be determined using Equation 7.

$$L > \frac{Z_{LE}}{2\pi(PPRF)} - \frac{1}{2\pi(PPRF)g_m} \qquad \text{Eq. (7)}$$

To the extent that the source capacitor 352 is a function of the source inductor 354, the source capacitor 352 can be expressed by incorporating Equation 7 to Equation 6.

The LC degeneration circuit 350 may include additional features to allow the LPLPN 300 to operate flexibly. In one implementation, for example, the LC degeneration circuit 350 may include a bank of source capacitor, such as the source capacitor 352, and circuit options for selecting a set of source capacitors that meet the criteria of Equation 6 for matching a specific primary resonant frequency. This particularly implementation allows the LPLPN oscillator system 300 to have the flexibility of adopting various primary resonant frequencies as defined by the LC load network 310. In another implementation, for example, the LC degeneration circuit 350 may include a bank of source inductors, such as the source inductor 354, and circuit options for selecting a set of source inductors that meet the criteria of Equation 7 over a wide range of PPRFs. That way, the LC degeneration circuit 350 can be adaptive to changes of parasitic effects introduced by the first and second high parasitic connection paths 312 and 314.

By offsetting the load impedance $Z_L$, the LC degeneration circuit 350 degenerates or compensates the parasitic effects of the first and second high parasitic connection paths 312 and 314 over a range of PPRFs. Moreover, the LC degeneration circuit 350 also serves as a resonator that demonstrates band-pass filter characteristics because it provides low impedance at the primary resonant frequency as well as high impedance over a frequency range that is outside of the primary resonant frequency.

With the implementation of the LC degeneration circuit 350, PPRF related noise signals (a.k.a. PPRF oscillations) can be suppressed without removing or replacing the high parasitic connection paths 312 and 314. As disclosed above, the high parasitic connection paths 312 and 314 include bonding pads and bonding wires for connecting the LC load network 310, which can be implemented on a MEMS-based device, to the cross-coupled amplifier pair 320. Advantageously, the implementation of the LC degeneration circuit 350 simplifies the fabrication process and reduces fabrication costs of an oscillator system that suppresses PPRF oscillations.

The implementation of the IC degeneration circuit 350 also obviates the need to include a load capacitor for the purpose of reducing the effective load impedance over a range of PPRFs. Indiscriminatingly, the load capacitor not only reduces the effective load impedance ($Z_{LE}$) over the range of PPRFs, but it also reduces the load impedance ($Z_L$) at the primary resonant frequency. A reduction of the load impedance ($Z_L$) translates to a reduction of the loop gain ($G_{LP}$) of the oscillator system. Thus, an oscillator system incorporating a load capacitor is likely to generate an oscillation output with smaller swing amplitude, thereby rendering the oscillator system more susceptible to phase noises.

Unlikely the load capacitor, the LC degeneration circuit 350 does not sacrifice the performance of the LPLPN oscillator system 300 at the primary resonant frequency. This is because the LC degeneration circuit 350 does not suppress the loop gain ($G_{LP}$) at the primary resonant frequency. Rather, the LC degeneration circuit 350 promotes the loop gain ($G_{LP}$) at the primary resonant frequency by boosting the effective transconductance ($G_m$) of the cross-coupled amplifier pair 320. The boosted effective transconductance ($G_m$) enhances the primary oscillation signal and thus helps reduce phase noises. Advantageously, the LC degeneration circuit 350 provides a means for suppressing PPRF oscillations while enhancing the signal-to-noise ratio of the LPLPN oscillator system 300.

In addition to the LC degeneration circuit 350, the LPLPN oscillator system 300 may also include a bias circuit according to an aspect of the present disclosure. In one implementation, for example, the bias circuit includes a first CS bias transistor 360 and a second CS bias transistor 370. Together, the first and second CS bias transistors 360 and 370 are configured to equalize an operational difference between the first and second CS amplifiers 330 and 340. More specifically, the first CS bias transistors 360 and the second CS bias transistor 370 help bias the common-mode voltage level of the cross-coupled amplifier pair 320. The common-mode voltage level of the first and second drain nodes 332 and 342 are biased to the gate-source voltages (e.g., Vgs) of the first and second CS bias transistors 360 and 370 respectively.

The first CS bias transistor 360 includes a first bias drain node 362, a first bias gate 364, and a first bias source node 366. The first bias drain node 362 is connected to the first source node 336 of the first CS amplifier 330. The first bias gate 364 is connected to the first drain node 332 of the first CS amplifier 330. The first bias source node 366 is connected to the ground source 304. The first bias gate 364 is configured to receive a first output voltage from the first drain node 336. The first output voltage drives the first bias gate 364 to maintain a first source voltage at the first source node 336. In return, the first source voltage helps adjust the first bias current delivered by the first current source 302.

The second CS bias transistor 370 includes a second bias drain node 372, a second bias gate 374, and a second bias source node 376. The second bias drain node 372 is connected to the second source node 346 of the second CS amplifier 340. The second bias gate 374 is connected to the second drain node 342 of the second CS amplifier 340. The second bias source node 376 is connected to the ground source 304. The second bias gate 374 is configured to receive a second output voltage from the second drain node 346. The second output voltage drives the second bias gate 374 to maintain a second source voltage at the second source node 346. The second source voltage helps adjust the second bias current delivered by the second current source 304. The current adjustments allow the first and second CS amplifiers 330 and 340 to operate under equalized conditions, such that the CS amplifiers 330 and 340 may each have a matching effective transconductance ($G_m$).

The bias circuit also allows the LC degeneration circuit 350 to keep the LPLPN oscillator system 300 from experiencing latch-up effects. At a direct current (DC) mode, the DC gain of the cross-coupled amplifier pair 320 is sufficiently low due to source impedance defined by the LC degeneration circuit 350. This is because the drain-to-source resistance of the CS bias transistors 360 and 370 confined the DC gain to a threshold that is low enough to prevent latch-up effects. With a low DC gain, the cross-coupled amplifier pair 320 develops a suppressed DC loop gain (e.g., less than unity), such that the outputs of the cross-coupled amplifier pair 320 will no longer be latched.

In addition to the biasing circuit, the LPLPN oscillator system 300 may further include a calibration capacitor 305 that can be used for adjusting the primary resonant frequency defined by the LC load network 310. The calibration capacitor 305 is coupled in parallel with the LC load network 310, which may include one or more resonator loads as described previously. In general, increasing the capacitance of the calibration capacitor 305 will reduce the primary resonant frequency, whereas decreasing the capacitance of the calibration capacitor 305 will increase the primary resonant frequency.

The resonator load (e.g., the resonator load 102, the resonator load network 210, and the LC load network 310) may include a bulk acoustic wave (BAW) resonator in one implementation. The BAW resonator can be formed on a MEMS-based device, and it may have a primary resonant frequency of 1 GHz or above. In an alternative embodiment, the resonator load may include a crystal resonator that has a primary resonant frequency below 1 GHz.

Figure 4:
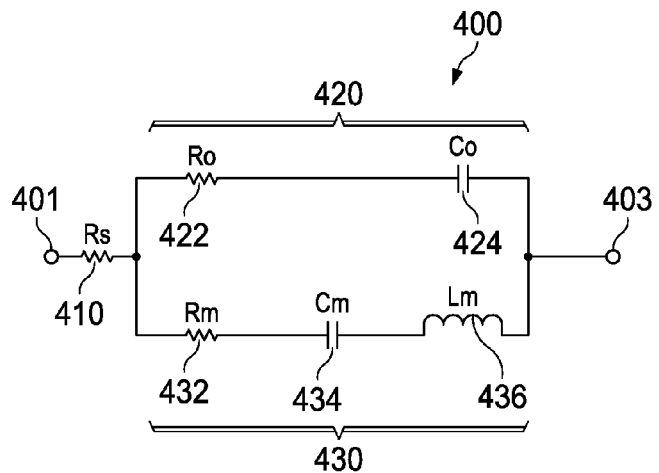
FIG. 4 shows a schematic view of an exemplary resonator according to an aspect of the present disclosure.

FIG. 4 shows a schematic view of an exemplary resonator 400 according to an aspect of the present disclosure. The resonator 400 provides an electrical model for the resonator load 102, the resonator load network 210, and the LC load network 310. In one implementation, the resonator 400 can be used for modeling the behavior of a MEMS-based resonator, such as a MEMS-based BAW resonator. The resonator 400 includes a static group 420 of modeling components and a mechanical group 430 of modeling components. The static group 420 includes a static resistor ($R_o$) 422 and a static capacitor ($C_o$) 424. The static resistor 422 is connected in series with the static capacitor 424, the resulting series of which is coupled in parallel with the mechanical group 430 of modeling components. The static resistor 422 represents the electrical loss between two electrode pads of the resonator 400 (e.g., the first and second ends 311 and 313), whereas the static capacitor 424 represents the static capacitance between the two electrode pads of the resonator 400.

In an implementation that the resonator 400 is a MEMS-based device, the resonator 400 vibrates at a mechanical resonant frequency in response to an applied electric field. The mechanical group 430 includes a mechanical resistor ($R_m$) 432, a mechanical capacitor ($C_m$) 434, and a mechanical inductor ($L_m$) 436. The mechanical capacitor 434 and the mechanical inductor 436 represent the mechanical resonance of the resonator 400 whereas the mechanical resistor 432 represents the mechanical loss of the resonator 400. The resonator 400 also includes an interconnect resistor ($R_s$) 410. In general, the interconnect resistor ($R_s$) 410 represents the electrical loss of the metal traces disposed to provide interconnections between the modeling components (e.g., the static group 420 and the mechanical group 430) and the bonding pads formed on the resonator 400 (e.g., a MEMS resonator).

Figure 5:
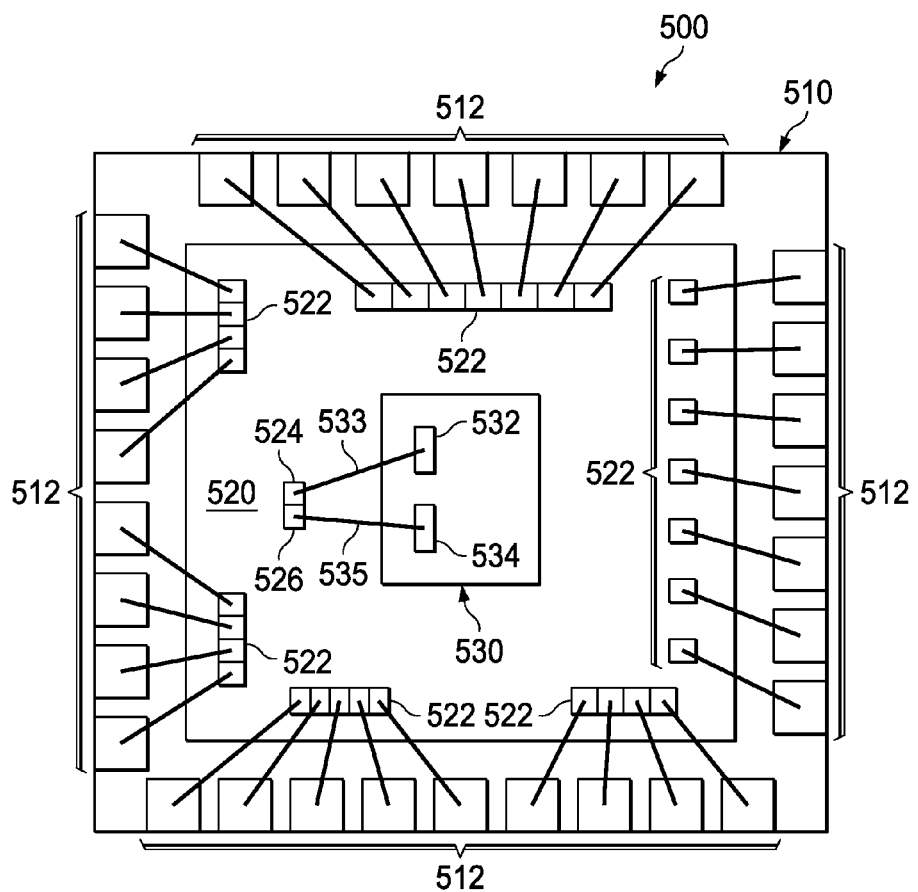
FIG. 5 shows a top view of an exemplary micro-electromechanical system based (MEMS-based) oscillator system according to an aspect of the present disclosure.

FIG. 5 shows a top view of an exemplary micro-electromechanical system based (MEMS-based) oscillator system 500 according to an aspect of the present disclosure. The MEMS-based oscillator system 500 includes features consistent with the descriptions associated with exemplary architectures as shown in FIGS. 1-4. For example, the MEMS based oscillator system 500 includes a MEMS die 530, an integrated circuit die 520, and a package substrate 510. The MEMS die 530 can be an exemplary embodiment of the LC load network 310 as disclosed with respect to FIG. 3. In general, the MEMS die 530 may include a MEMS-based resonator. More particularly, for example, the MEMS die 530 may include a MEMS-based BAW resonator. The primary resonant frequency established by the circuitry within the MEMS die 530 can range from 30 MHz to 4 GHz in one implementation, or more specifically, from 200 MHz to 3 GHz in another implementation.

The MEMS die 530 is incorporable to the integrated circuit die 520 The MEMS die 530 includes a first bonding pad 532 and a second bonding pad 534. In association with FIG. 3, for example, the first bonding pad 532 can be used for accessing the first end 311 of the LC load network 310, whereas the second bonding pad 534 can be used for accessing the second end 313 of the LC load network 310. As such, the integrated circuit die 520 can access and be coupled with the LC load network 310 via the first and second bonding pads 532 and 534.

Like the MEMS die 530, the integrated circuit die 520 also includes two IC bonding pads 524 and 526, which are respectively connected with the first and second bonding pads 532 and 534 via a pair of bonding wires 533 and 535. After establishing the respective connections, the first end 311 of the LC load network 310 is coupled with the first drain node 332 of the first CS amplifier 330 via the first bonding pad 532, the first bonding wire 533, and the first IC bonding pad 524. Similarly, the second end 313 of the LC load network 310 is coupled with the second drain node 342 of the second CS amplifier 340 via the second bonding pad 534, the second bonding wire 535, and the second IC bonding pad 526. Together, the first bonding pad 532, the first bonding wire 533, and the first IC bonding pad 524 create the parasitic effect of the first high parasitic connection path 312; and the second bonding pad 534, the second bonding wire 535, and the second IC bonding pad 526 create the parasitic effect of the second high parasitic connection path 314.

Depending on the architecture being implemented, the integrated circuit die 520 may, for example, include the cross-coupled amplifier pair 320, the LC degeneration circuit 350, and the current sources 302 and 303 as disclosed with respect to FIG. 3. The integrated circuit die 520 may also include terminals for receiving the power source 301 and the ground source 304. The integrated circuit die 520 is assembled on top of the package substrate 510. The integrated circuit die 520 also includes peripheral bonding pads 522 for connecting with the package bonding pads 512 of the package substrate 510.

Figure 6:
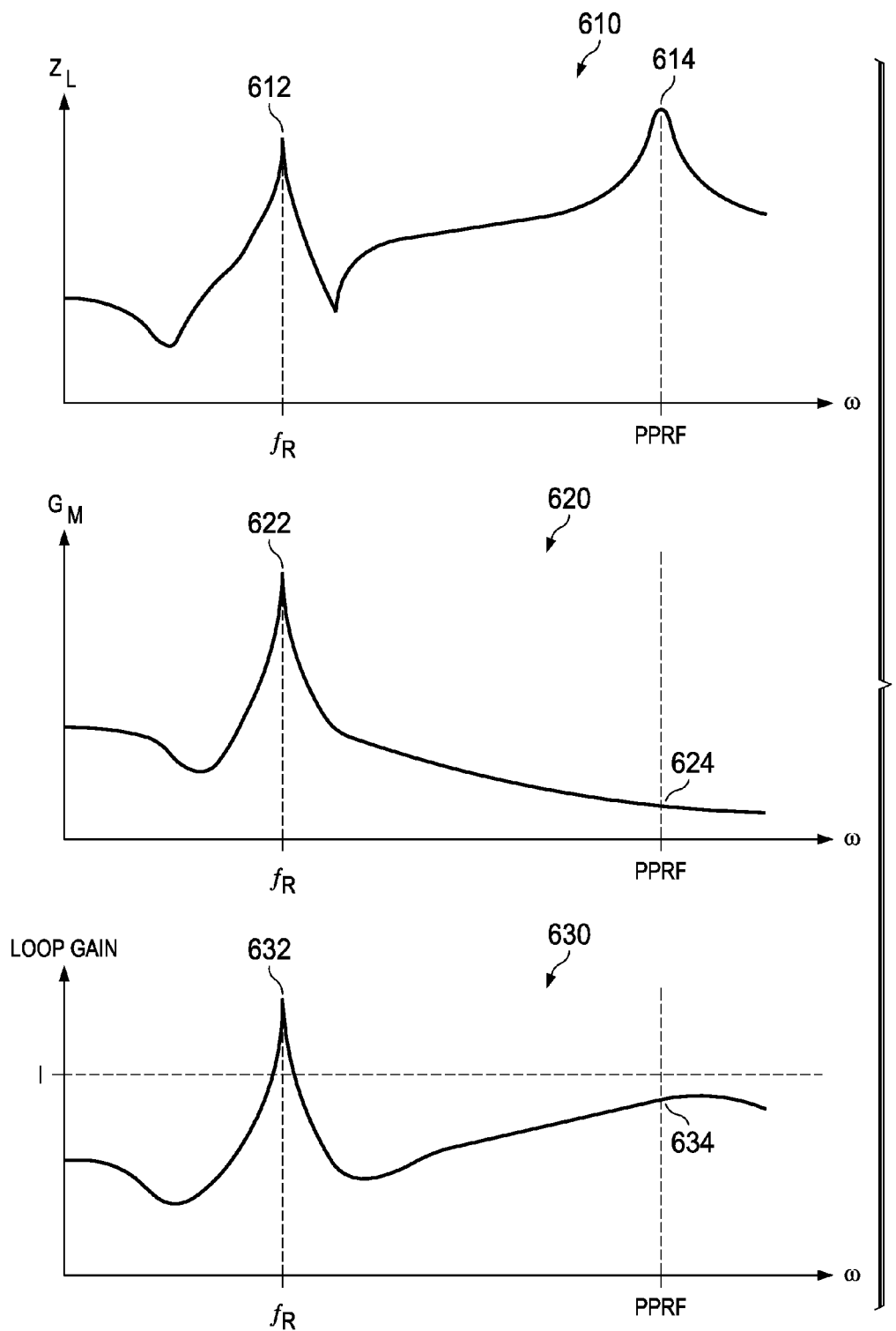
FIG. 6 shows frequency spectral waveforms of an exemplary LPLPN oscillator system according to an aspect of the present disclosure.

FIG. 6 shows frequency spectral waveforms of an exemplary LPLPN oscillator system according to an aspect of the present disclosure. The exemplary LPLPN oscillator system can be any one of the LPLPN oscillator systems 100, 200, and 300, as well as the MEMS-based oscillator 500. Thus, various characteristics of the exemplary LPLPN oscillator as described in FIG. 6 are consistent with, and thus should be understood in view of, the descriptions regarding FIGS. 1-5.

Waveform 610 shows the variation of the effective load impedance ($Z_L$) of the exemplary LPLPN oscillator system over a frequency spectrum. Due to the LC characteristics of a resonator load (or a resonator load network), the effective load impedance ($Z_L$) reaches a first peak 612 at the primary resonant frequency ($f_R$). And due to the parasitic effects of the connection paths between the resonator load and the amplifier stage (or a cross-coupled amplifier pair), the effective load impedance ($Z_L$) reaches a second peak 614 at the PPRF.

Waveform 620 shows the variation of the effective transconductance ($G_m$) of the exemplary LPLPN oscillator system over a frequency spectrum. As disclosed regarding the LC degeneration circuit 350 in FIG. 3, the source impedance provided by the LC degeneration circuit 350 regulates the effective transconductance ($G_m$). In one aspect, for example, the source impedance reaches a minimum value at the primary resonant frequency ($f_R$). Due to the reduced source impedance, the LC degeneration circuit 350 substantially boosts the effective transconductance ($G_m$) to a peak 622, which approaches the intrinsic transconductance ($g_m$) of the cross-coupled amplifier pair 320 at the primary resonant frequency ($f_R$). In another aspect, for example, the source impedance reaches a high plateau outside the primary resonant frequency ($f_R$) because of the high impedance characteristics of the source inductor 354. Due to the enhanced source impedance, the LC degeneration circuit 350 substantially suppresses the effective transconductance (Gm) to a floor level 624 at the PPRF.

Waveform 630 shows the variation of the loop gain of the exemplary LPLPN oscillator system over a frequency spectrum. When the effective transconductance ($G_m$) peak 622 overlaps with the first effective load impedance ($Z_L$) peak 612 at the primary resonant frequency ($f_R$), the loop gain is boosted to reach a peak 632 above a unity gain. As a result, the LPLPN oscillator system generates an oscillation signal at the primary resonant frequency ($f_R$). When the effective transconductance ($G_m$) floor level 624 offsets the second effective load impedance ($Z_L$) peak 614 at the PPRF, the loop gain reaches a plateau 634, which is kept under a unity gain. As a result, the LPLPN oscillator system suppresses a noise signal at the PPRF such that it does not oscillate.

Figure 7:
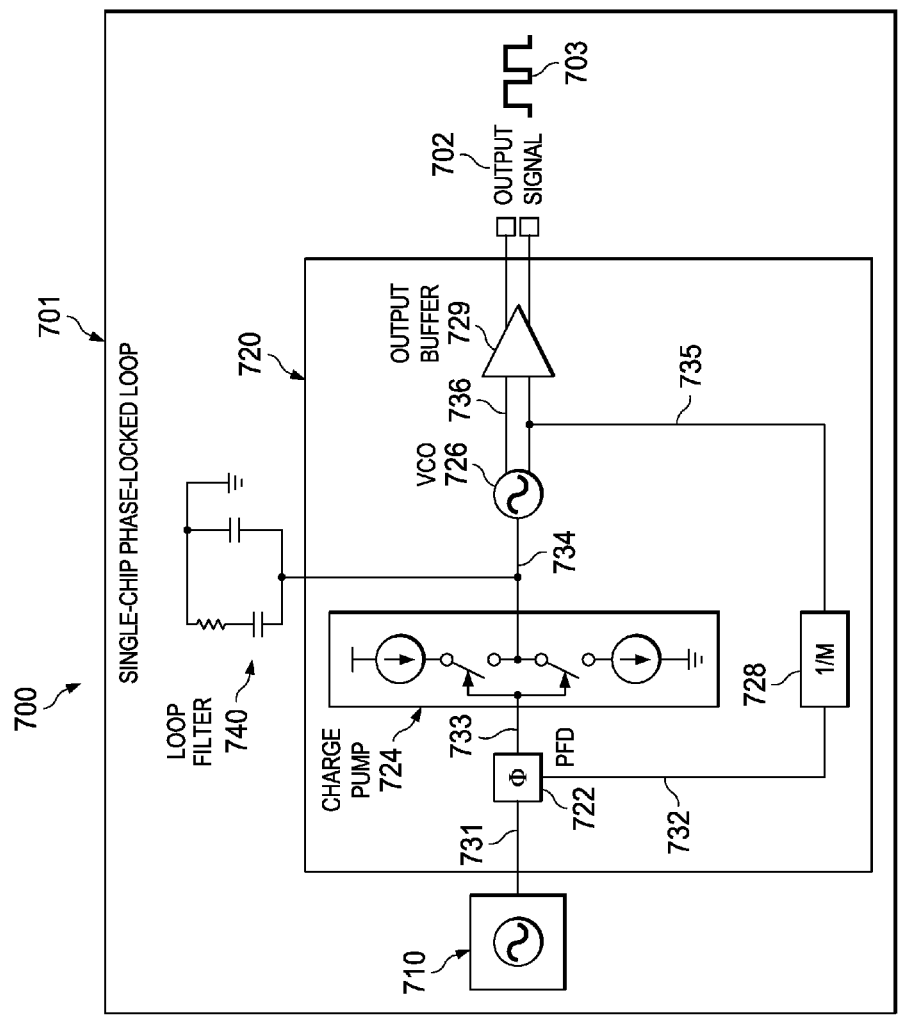
FIG. 7 shows a schematic view of an exemplary phase-lock loop (PLL) system incorporating an LPLPN oscillator according to an aspect of the present disclosure.

FIG. 7 shows a schematic view of an exemplary phase-lock loop (PLL) system 700 incorporating an LPLPN oscillator 710 according to an aspect of the present disclosure. The PLL system 700 is formed on a single integrated circuit die 701, which can be implemented in a similar fashion as the integrated circuit die 520 as shown and described in FIG. 5. The LPLPN oscillator 710 can be implemented by the circuit architecture as shown and discussed in FIGS. 1-4. In one implementation, for example, the LPLPN oscillator 710 may be implemented according to the LPLPN oscillator system 300 as shown in FIG. 3. Moreover, the LPLPN oscillator 710 may be a MEMS-based device such that the resonator portion (e.g., the LC load network 310 and/or the resonator 400) can be implemented on a MEMS die (e.g., MEMS die 530).

In addition to the LPLPN oscillator 710, the PLL system 700 includes a PLL control circuit 720. The PLL control circuit 720 is coupled with the LPLPN oscillator 710 via a first interconnect 731 formed within the integrated circuit die 701. The LPLPN oscillator 710 is configured to provide a low-noise oscillation signal as a reference for the PLL control circuit 720. Consistent with the aforementioned disclosure, the low-noise reference signal is set to oscillate at a primary resonant frequency tunable based on the options provided by the resonator (e.g., the LC load network 310).

The PLL control circuit 720 includes a phase/frequency detector (PFD) 722, a charge pump 724, a voltage control oscillator (VCO) 726, a frequency divider 728, and an output buffer 729. The PFD 722 is configured to receive the reference signal from the LPLPN oscillator 710 via the first interconnect 731, and the PFD 722 is also configured to receive a frequency adjusted signal via a second interconnect 732. Like the first interconnect 731, the second interconnect 732 is formed within the integrated circuit die 701. The PFD 722 is configured to compare a difference (e.g., a phase difference or a frequency difference) between the reference signal and the adjusted frequency signal for generating a differential signal representing such a difference.

The PFD 722 is coupled with the charge pump 724 via a third interconnect 733 formed on the integrated circuit die 701. The PFD 722 is routed to deliver the differential signal to the charge pump 724, which in turn, is configured to generate an oscillation control signal for adjusting the VCO 726. The charge pump 724 is routed to deliver the oscillation control signal to the VCO 726 via a fourth interconnect 734, which is also formed within the integrated circuit die 701. For filtering out the noise presented in the oscillation control signal, the PLL system 700 includes a loop filter 740 coupled to the fourth interconnect 734 or any other adjacent circuitries.

Upon receiving the oscillation control signal, the VCO 726 is configured to generate a pair of differential oscillation signals. The frequency of the differential oscillation signals are fine-tuned by the oscillation control signal. One of the differential oscillation signals is delivered to a fifth interconnect 735, which is coupled to the frequency divider 728. The frequency divider 728 is configured to reduce the frequency of the oscillation signal by a factor of M for generating the adjusted frequency signal. The frequency divider 728 is routed to deliver the adjusted frequency signal to the PFD 722 via the second interconnect 732, thereby completing a feedback loop that begins at the PFD 722.

The VCO 726 is coupled with the output buffer 729 via a sixth interconnect 736, which is also formed on the integrated circuit die 701. The output buffer 726 is configured to amplify the differential oscillation signals. The amplified signals are delivered to a pair of output bonding pads 702, which is structured to deliver a pair of phase-locked output signals 703.

Figure 8:
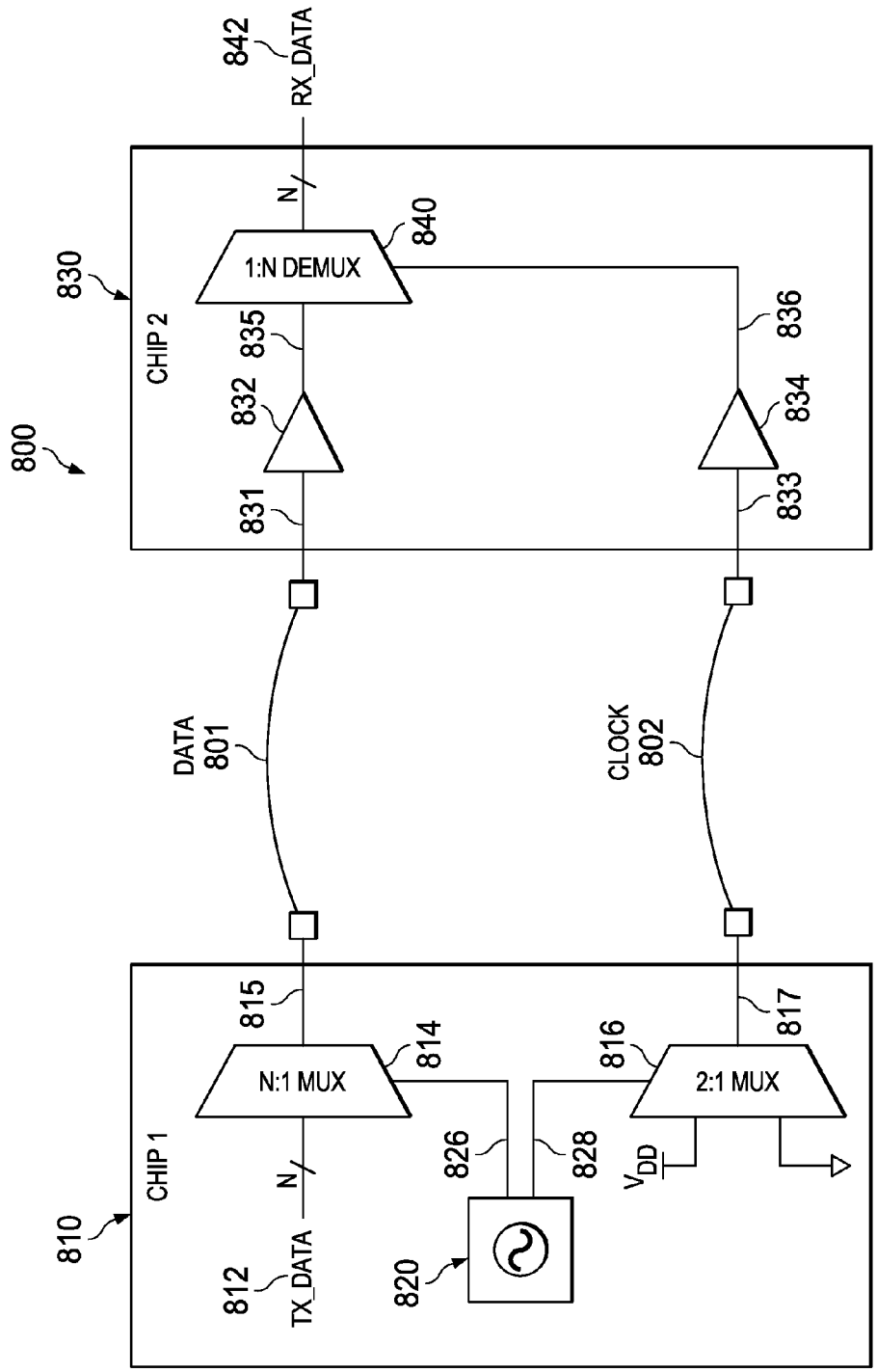
FIG. 8 shows a schematic view of an exemplary serial communication system incorporating an LPLPN oscillator according to an aspect of the present disclosure.

FIG. 8 shows a schematic view of an exemplary serial communication system 800 incorporating an LPLPN oscillator 820 according to an aspect of the present disclosure. The serial communication system 800 includes a transmission integrated circuit 810 and a reception integrated circuit 830. The transmission integrated circuit 810 can be implemented in a similar fashion as the integrated circuit die 520 as shown and described in FIG. 5. The transmission integrated circuit 810 and the reception integrated circuit 830 are connected via a serial data link 801 and a synchronization link 802. The serial data link 801 is a physical conduit for carrying serial data. The synchronization link 802 is a physical conduit for carrying synchronization information for synchronizing the transmission and reception of the serial data.

The transmission integrated circuit 810 includes a first multiplexer 814, a second multiplexer (synchronizer) 816, and the LPLPN oscillator 820. The first multiplexer 814 performs the function of a serializer by converting a set of transmission data 812 into a serial bit stream 815. The first multiplexer 814 may include multiple (N) input ports and a single serial output port. Each of the input ports receives a bit of the transmission data 812, and the serial output port is configured to transmit the received bits at a bit rate controlled by the LPLPN oscillator 820. The second multiplexer 816 performs the function of a synchronizer by generating a clock signal 817 that synchronizes with the bit rate of the serial bit stream 815. In particular, the second multiplexer 816 includes two input ports—one is connected to an internal power source (e.g., VDD) and the other one is connected to an internal ground source. The multiplexer 816 also includes a single output port that is configured to be coupled with either one of the input ports in an alternating pattern controlled by the LPLPN oscillator 820.

The LPLPN oscillator 820 can be implemented by the circuit architecture as shown and discussed in FIGS. 1-4. In one implementation, for example, the LPLPN oscillator 820 may be implemented according to the LPLPN oscillator system 300 as shown in FIG. 3. Moreover, the LPLPN oscillator 710 may be a MEMS-based device such that the resonator portion (e.g., the LC load network 310 and/or the resonator 400) can be implemented on a MEMS die (e.g., MEMS die 530).

The LPLPN oscillator 820 is configured to provide a low-noise oscillation signals as control signals for the first multiplexer 814 and the second multiplexer 816. In one implementation, the LPLPN oscillator 820 is configured to generate a bit rate control signal 826 for controlling the bit rate of the serialized bit stream 815. Consistent with the aforementioned disclosure, the bit rate can be controlled by adjusting the primary resonant frequency at which the bit rate control signal 826 oscillates. In another implementation, the LPLPN oscillator 820 is configured to generate a clock rate control signal 828 for controlling the alternating pattern of the clock signal 817. Consistent with the aforementioned disclosure, the clock rate can be controlled by adjusting the primary resonant frequency at which the bit rate control signal 826 oscillates.

The serialized data stream 815 and the clock signal 817 are transmitted to the reception integrated circuit 830 via the serial data link 801 and the synchronization link 802 respectively. The reception integrated circuit 830 includes a data input buffer 832, a clock input buffer 834, and a reception multiplexer 840. The data input buffer 832 is configured to receive a serialized data input 831 from the serial data link 801, and it is further configured to amplified the serialized data input 831 for generating a buffered serialized data signal 835. The clock input buffer 834 is configured to receive a clock input signal 833 from the synchronization link 802, and it is further configured to amplify the clock input signal 833 for generating a buffered clock signal 836.

The reception multiplexer 840 is configured to perform the functions of a deserializer by restoring the serialized data signal 835 to a format compatible with the transmission data 812. For example, the reception multiplexer 840 is configured to generate a set of reception data 842 for retrieving the information carried by the transmission data 812. Specifically, the reception multiplexer 840 receives the buffered clock signal 836 as a selection control, through which the reception multiplexer 840 is able to deserialize the serialized data signal 835 at a clock rate that synchronizes with the bit rate of the serialized data signal 835.

Figure 9:
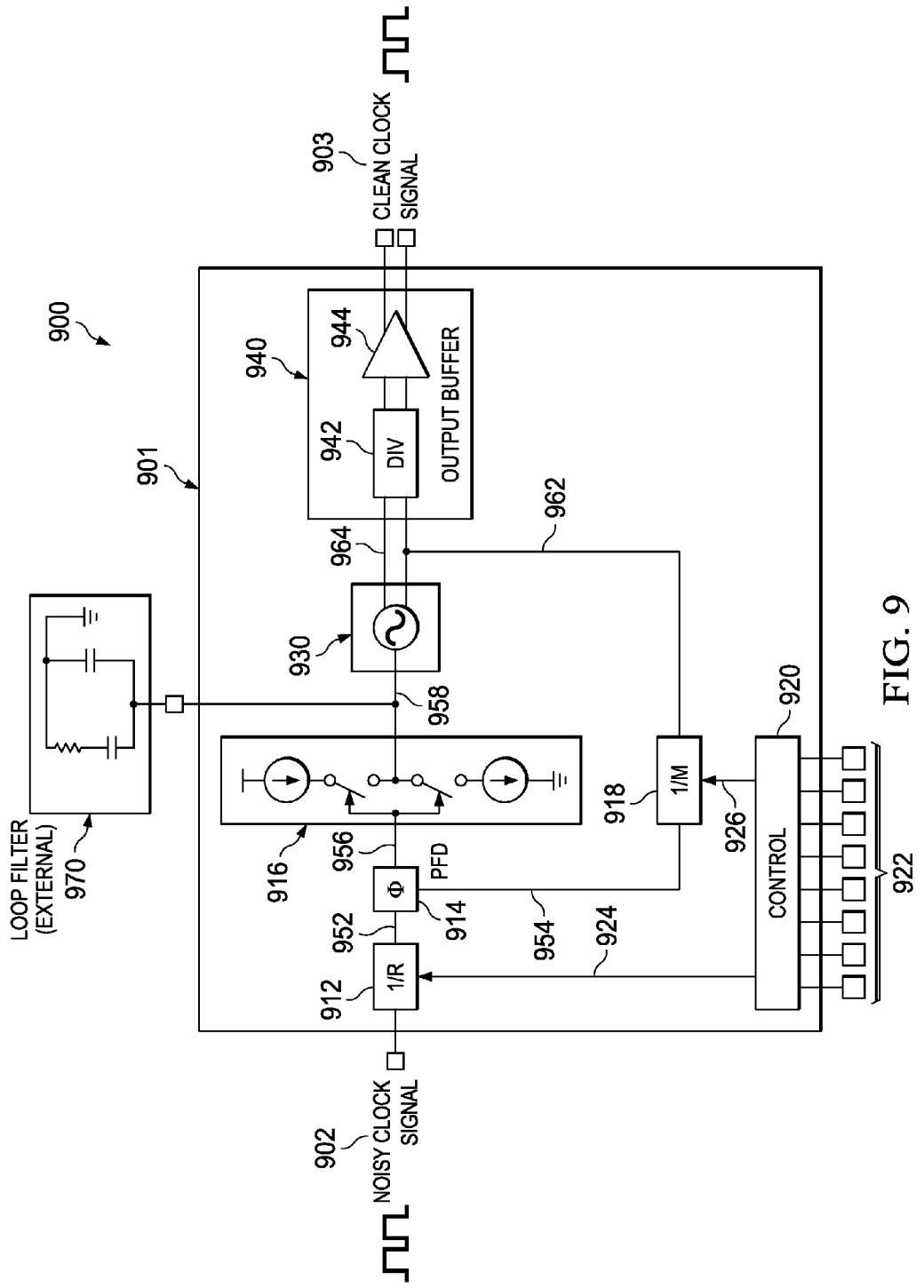
FIG. 9 shows a schematic view of an exemplary clock jitter cleaner system incorporating an LPLPN oscillator according to an aspect of the present disclosure.

FIG. 9 shows a schematic view of an exemplary clock jitter cleaner (CJC) system 900 incorporating an LPLPN oscillator 930 according to an aspect of the present disclosure. The CJC system 900 is formed on a single integrated circuit die 901, which can be implemented in a similar fashion as the integrated circuit die 520 as shown and described in FIG. 5. The LPLPN oscillator 930 can be implemented by the circuit architecture as shown and discussed in FIGS. 1-4. In one implementation, for example, the LPLPN oscillator 930 may be implemented according to the LPLPN oscillator system 300 as shown in FIG. 3. Moreover, the LPLPN oscillator 930 may be a MEMS-based device such that the resonator portion (e.g., the LC load network 310 and/or the resonator 400) can be implemented on a MEMS die (e.g., MEMS die 530).

The CJC system 900 is configured to convert a noisy clock signal 902 to a clean clock signal 903. The CJC system 900 includes a frequency divider 912, a phase/frequency detector (PFD) 914, a charge pump 916, a voltage control oscillator (VCO) implemented by the LPLPN oscillator 930, and a frequency divider 918. The frequency divider 912 is configured to receive the noisy clock signal 902 and reduce the power level of the noisy clock signal 902 at its output. The frequency divider 912 is coupled with the PFD 914 via a first interconnect 952, which is formed within the integrated circuit die 901. Through the first interconnect 952, the frequency divider 912 delivers the power-reduced noisy clock signal to the PFD 914.

The PFD 914 is also configured to receive a frequency adjusted signal via a second interconnect 954. Like the first interconnect 952, the second interconnect 954 is formed within the integrated circuit die 901. The PFD 914 is configured to compare a difference (e.g., a phase difference or a frequency difference) between the power-reduced noisy clock signal and the adjusted frequency signal for generating a differential signal representing such a difference.

The PFD 914 is coupled with the charge pump 916 via a third interconnect 956 formed on the integrated circuit die 901. The PFD 914 is routed to deliver the differential signal to the charge pump 916 which in turn, is configured to generate an oscillation control signal for adjusting the VCO 930. The charge pump 916 is routed to deliver the oscillation control signal to the VCO 930 via a fourth interconnect 958, which is also formed within the integrated circuit die 901. For filtering out the noise presented in the oscillation control signal, the CJC system 900 includes a loop filter 970 coupled to the fourth interconnect 958 or any other adjacent circuitries. By removing the noise in the oscillation control signal, the loop filter 970 effectively removes the noisy components in the noisy dock signal 902.

Upon receiving the oscillation control signal, the VCO 930 is configured to generate a pair of differential oscillation signals. The frequency of the differential oscillation signals are fine-tuned by the oscillation control signal. In one implementation, for example, the frequency of the differential oscillation signals is based on the primary resonant frequency of a resonator in the VCO 930 (which can be implemented by the LPLPN oscillator 930). When a BAW filter is adapted as a part of the resonator load (e.g., 102, 310, 400), the oscillation control signal can be used for tuning the primary resonant frequency by adjusting the electrical strain of the BAW filter. One of the differential oscillation signals is delivered to a fifth interconnect 962, which is coupled to the frequency divider 918. The frequency divider 918 is configured to reduce the frequency of the oscillation signal by a factor of M for generating the adjusted frequency signal. The frequency divider 918 is routed to deliver the adjusted frequency signal to the PFD 914 via the second interconnect 954, thereby completing a feedback loop that begins at the PFD 914.

The CJC system 900 also includes a control circuit 920 for controlling the operations of the frequency divider 912 and the frequency divider 918. Specifically, the control circuit 920 is configured to receive external control inputs via a set of input bonding pads 922. Based on the external control inputs, the control circuit 920 is configured to generate a resistance adjustment signal 924 for adjusting the frequency divider 912, as well as a frequency adjustment signal 926 for adjusting the frequency divider 918.

The VCO 930 is coupled with the output buffer 940 via a sixth interconnect 964, which is also formed on the integrated circuit die 901. The output buffer 940 is configured to amplify the differential oscillation signals. In one implementation, the output buffer 940 may include a divider 942 and an amplifier 944. The amplified signals are delivered to a pair of output bonding pads, which is structured to deliver a pair of clean clock signal 903.

The present disclosure provides circuit architecture for an oscillator in which a series of LC network is deployed at the source nodes of a pair of cross-coupled MOSFET transistors (or the emitter nodes of a pair of cross-coupled bipolar junction transistors) instead of deploying only a single capacitor thereat. Since the source impedance (Zs) of the LC network is only a few ohms, the effective transconductance (Gm) of the pair of cross-coupled transistors can be boosted to its maximum value, which can approach the intrinsic transconductance (gm1, 2) of the pair of transistors. Thus, the series of LC network defines a higher effective transconductance (Gm), thereby allowing the oscillator to generate a larger output voltage swing in a given current condition. Moreover, the larger effective transconductance (Gm) may help increases the signal-to-noise ratio of the oscillator. As such, the phase noise of the oscillator can be kept below a minimum threshold.

The series of LC network also prevents the oscillator from oscillating at a PPRF. The series of LC network can act as a source resonator, which provides low impedance at the primary resonant frequency band and in contrast, high impedance over the rest of the frequency band. To that end, the series LC network possesses band-pass filter characteristics that facilitate the generation of the oscillation signal. As a result, the loop gain of the oscillator can be well suppressed below unit at the PPRF, thereby avoiding the parasitic oscillation.

The quality factor of the source inductor in the series of LC network does not much affect the circuit performance (e.g., phase noise) of the oscillator because it is not placed in the path of the oscillation signal. Therefore, the fabrication of the oscillator does not require any special metal layer fabrication process in building the LC network.

A few embodiments have been described in detail above, and various modifications are possible. The disclosed subject matter, including the functional operations described in this specification, can be implemented in electronic circuitry, computer hardware, firmware, software, or in combinations of them, such as the structural means disclosed in this specification and structural equivalents thereof, including potentially a program operable to cause one or more data processing apparatus to perform the methods and/or operations described (such as a program encoded in a computer-readable medium, which can be a memory device, a storage device, a machine-readable storage substrate, or other physical, machine-readable medium, or a combination of one or more of them).

While this specification contains many specifics, these should not be construed as limitations on the scope of what may be claimed, but rather as descriptions of features that may be specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results unless such order is recited in one or more claims. In certain circumstances, multitasking and parallel processing may be advantageous. Moreover, the separation of various system components in the embodiments described above should not be understood as requiring such separation in all embodiments.

What is claimed is:

1. An oscillator, comprising:
a micro-electromechanical system based (MEMS-based) resonator structured to resonate at a primary resonant frequency;
a pair of cross-coupled amplifiers coupled with the MEMS-based resonator to develop a loop gain peaking at the primary resonant frequency; and
an inductive-capacitive (LC) degeneration circuit coupled with the pair of cross-coupled amplifiers, and structured to regulate the loop gain for facilitating the pair of cross-coupled amplifiers to generate an oscillation signal at the primary resonant frequency and suppress a noise signal at a parasitic parallel resonant frequency (PPRF).

2. The oscillator of claim 1, wherein the MEMS-based resonator includes a balk acoustic wave (BAW) resonator structured to oscillate at the primary resonant frequency at or above 1 GHz.

3. The oscillator of claim 1, wherein:
the MEMS-based resonator is formed on a first die having a first bonding pad coupled with the MEMS-based resonator;
the pair of cross-coupled amplifiers are formed on a second die having a second bonding pad coupled with the pair of cross-coupled amplifier; and
a bonding wire connecting the first bonding pad with the second bonding pad, thereby creating a parasitic structure contributing to the PPRF.

4. The oscillator of claim 1, wherein:
the pair of cross-coupled amplifiers include:
a first common-source (CS) amplifier having a first source node; and
a second CS amplifier cross-coupling with the first CS amplifier, the second CS amplifier having a second source node; and
the LC degeneration circuit is connected between the first and second source nodes, and the LC degeneration circuit includes a source inductor and a source capacitor to jointly define an effective transconductance of the first and second CS amplifiers.

5. The oscillator of claim 4, wherein:
the source capacitor and the source inductor are structured to provide a source impedance of the pair of cross-coupled amplifiers; and
the source impedance varies within a frequency range for boosting the effective transconductance at the primary resonant frequency while reducing the effective transconductance at the PPRF.

6. The oscillator of claim 5, wherein at the primary resonant frequency, the source impedance approaches zero, such that the effective transconductance approaches an intrinsic transconductance of the first and second CS amplifiers, thereby boosting the loop gain of the cross-coupled amplifiers above unity.

7. The oscillator of claim 4, wherein:
the first CS amplifier includes:
a first drain node coupled with the MEMS-based resonator to receive a load impedance, the first drain node configured to receive a first current from a first current source;
a first gate configured to adjust a first output voltage at the first drain node; and
the first source node coupled with a first terminal of the LC degeneration circuit; and
the second CS amplifier includes:
a second drain node coupled with the MEMS-based resonator to receive the load impedance, the second drain node coupled with the first gate to provide a second stage feedback to the first CS amplifier, the second drain node configured to receive a second current from a second current source;
a second gate configured to adjust a second output voltage at the second drain node, the second gate coupled with the first drain to receive a first stage feedback from the first CS amplifier; and
the second source node coupled with a second terminal of the LC degeneration circuit.

8. The oscillator of claim 4, further comprising:
a bias circuit coupled with the first and second source nodes of the first and second CS amplifiers respectively to equalize an operational difference between the first and second CS amplifiers.

9. The oscillator of claim 1, further comprising:
a calibration capacitor coupled in parallel with the MEMS-based resonator for adjusting the primary resonant frequency.

10. An oscillator, comprising:
an inductive-capacitive (LC) load network structured to resonate at a primary resonant frequency;
a first stage amplifier coupled with a first end of the LC load network;
a second stage amplifier cross-coupled with the first stage amplifier, and coupled with a second end of the LC load network to jointly develop a loop gain with the first stage amplifier; and
a loop gain control circuit coupled between the first stage amplifier and the second stage amplifier, the loop gain control circuit structured and routed to increase the loop gain above unity at the primary resonant frequency and reduce the loop gain below unity at a parasitic parallel resonant frequency (PPRF).

11. The oscillator of claim 10, wherein the LC load network includes an micro-electromechanical system based (MEMS-based) balk acoustic wave (BAW) resonator.

12. The oscillator of claim 10, wherein:
the LC load network is formed on a first die having a pair of first bonding pads coupled with the first and second ends of the LC load network respectively;
the first and second stage amplifiers are formed on a second die having a pair of second bonding pads coupled with the first and second stage amplifiers respectively; and
a pair of bonding wires respectively connecting the first bonding pads with the second bonding pads, thereby creating a parasitic structure contributing to the PPRF.

13. The oscillator of claim 10, wherein:
the first stage amplifier has a first effective transconductance defined partially by a first current source;
the second stage amplifier has a second effective transconductance defined partially by a second current source mirroring the first current source;
the loop gain control circuit includes a source inductor and a source capacitor coupled in series between the first and second stage amplifiers; and
the source inductor and the source capacitor jointly define a source impedance for boosting the first effective transconductance and the second effective transconductance at the primary resonate frequency while the first and second current sources remained unadjusted.

14. The oscillator of claim 13, wherein the source inductor and the source capacitor jointly define the source impedance for dampening the first effective transconductance and the second effective transconductance at the PPRF while the first and second current source remained unadjusted.

15. The oscillator of claim 13, wherein the loop gain control circuit regulates the loop gain by altering the first effective transconductance and the second effective transconductance across a frequency spectrum including the primary resonate frequency and the PPRF.

16. The oscillator of claim 13, wherein:
the first stage amplifier includes a first N-type transistor having a first intrinsic transconductance defined partially by the first current source;

the second stage amplifier includes a second N-type transistor having a second intrinsic transconductance defined partially by the second current source; and at the primary resonate frequency, the source inductor and the source capacitor jointly define the source impedance to approach zero, such that the first effective transconductance approaches the first intrinsic transconductance and the second effective transconductance approaches the second intrinsic transconductance while the first and second current sources remained unadjusted.

17. An oscillator system, comprising:

a first die having a micro-electromechanical system based (MEMS-based) resonator structured to resonate at a primary resonant frequency;

a second die having:
- a pair of cross-coupled amplifiers coupled with the MEMS-based resonator to develop a loop gain peaking at the primary resonant frequency; and
- a LC degeneration circuit coupled with the pair of cross-coupled amplifiers, and structured to regulate the loop gain for facilitating the pair of cross-coupled amplifier to generate an oscillation signal at the primary resonant frequency and suppress a noise signal at a parasitic parallel resonant frequency (PPRF); and interconnects coupling the MEMS-based resonator with the pair of cross-coupled amplifiers, thereby creating a parasitic structure contributing to the PPRF.

18. The system of claim 17, wherein:

the pair of cross-coupled amplifiers includes a first stage amplifier and a second stage amplifier cross-coupled with the first stage amplifier;

the first stage amplifier has a first effective transconductance defined partially by a first current source;

the second stage amplifier has a second effective transconductance defined partially by a second current source mirroring the first current source;

the LC degeneration circuit includes a source inductor and a source capacitor coupled in series between the first and second stage amplifiers; and the source inductor and the source capacitor jointly define a source impedance for peaking the first effective transconductance and the second effective transconductance at the primary resonate frequency while the first and second current sources remained unadjusted.

19. The system of claim 18, wherein the LC degeneration circuit regulates the loop gain by altering the first effective transconductance and the second effective transconductance across a frequency spectrum including the primary resonate frequency and the PPRF.

20. The system of claim 18, wherein:

the first stage amplifier includes a first N-type transistor having a first intrinsic transconductance defined partially by the first current source;

the second stage amplifier includes a second N-type transistor having a second intrinsic transconductance defined partially by the second current source; and at the primary resonate frequency, the source inductor and the source capacitor jointly define the source impedance to approach zero, such that the first effective transconductance approaches the first intrinsic transconductance and the second effective transconductance approaches the second intrinsic transconductance while the first and second current sources remained unadjusted.

* * * * *